(12) United States Patent
Mobin

(10) Patent No.: US 8,707,078 B2
(45) Date of Patent: Apr. 22, 2014

(54) METHODS AND APPARATUS FOR TRIMMING OF CDR CLOCK BUFFER USING HISTOGRAM OF CLOCK-LIKE DATA PATTERN

(75) Inventor: Mohammad S. Mobin, Orefield, PA (US)

(73) Assignee: LSI Corporation, San Jose, CA (US)

( * ) Notice: Subject to any disclaimer, the term of this patent is extended or adjusted under 35 U.S.C. 154(b) by 491 days.

(21) Appl. No.: 12/982,240

(22) Filed: Dec. 30, 2010

(65) Prior Publication Data

US 2012/0173914 A1 Jul. 5, 2012

(51) Int. Cl.
*G06F 1/12* (2006.01)
*H04L 7/04* (2006.01)

(52) U.S. Cl.
USPC .......................................................... 713/401

(58) Field of Classification Search
USPC .......................................................... 713/401
See application file for complete search history.

(56) References Cited

U.S. PATENT DOCUMENTS

| 4,847,876 A * | 7/1989 | Baumbach et al. ............ 375/364 |
| 6,999,544 B2 * | 2/2006 | Cranford et al. .............. 375/360 |
| 7,400,670 B2 * | 7/2008 | Hampel et al. ................ 375/219 |
| 7,542,372 B2 * | 6/2009 | Bae et al. .................... 365/233.1 |

* cited by examiner

*Primary Examiner* — Kim Huynh
*Assistant Examiner* — Eric Chang
(74) *Attorney, Agent, or Firm* — Ryan, Mason & Lewis, LLP

(57) ABSTRACT

Clock buffers in a clock and data recovery (CDR) system are trimmed by receiving a first transmitted clock-like data pattern in a reduced rate mode, locking the CDR using the received version of the first transmitted clock-like data pattern; and receiving a second transmitted clock-like data pattern. The first transmitted clock-like data pattern is transmitted using a first rate mode and the reduced rate mode divides the first rate mode by an integer value. The second transmitted clock-like data pattern has a run-length that is an integer division of a run-length of the first transmitted clock-like data pattern. A phase of the clock buffers is adjusted using the second transmitted clock-like data pattern. The received first transmitted clock-like data pattern has edges that correspond to only positive or negative edges of the first transmitted clock-like data pattern.

21 Claims, 7 Drawing Sheets

METHODS AND APPARATUS FOR TRIMMING OF CDR CLOCK BUFFER USING HISTOGRAM OF CLOCK-LIKE DATA PATTERN

FIELD OF THE INVENTION

The present invention relates generally to clock recovery techniques and, more particularly, to techniques for trimming one or more clock buffers in a clock and data recovery system, using a histogram of clock-like data patterns.

BACKGROUND OF THE INVENTION

In many applications, including digital communications, clock and data recovery (CDR) must be performed before data can be decoded. Generally, in a digital clock recovery system, timing information is extracted from the input serial data stream and a reference clock signal of a given frequency is generated, together with a number of different clock signals having the same frequency but with different phases. In one typical implementation, the different clock signals are generated by applying the reference clock signal to a delay network. Thereafter, one or more of the clock signals are compared to the phase and frequency of an incoming data stream and one or more of the clock signals are selected for data recovery.

FIG. 1 illustrates the transitions of a data stream histogram 100 for a given unit interval. As shown in FIG. 1, the data is "ideally" sampled in the middle of the unit interval between two transition points. The phases generated by the CDR system are adjusted to align with the transitions and sample points, respectively. Thus, the internal clock is typically delayed so that the data sampling is adjusted to the center of the "data eye," in a known manner. Such uniformly spaced transition and data sampling clock phases are generally considered useful under "ideal" circumstances.

The duty cycle of a clock signal can be expressed as the ratio of all pulse durations to the total period. A clock should typically demonstrate a 50% duty cycle. Duty cycle distortion arises, for example, due to mismatches in the clock buffers that are required to drive these clock phases, and due to variations in the different signal paths for clock and data. The target 50% duty cycle feature is particularly important for high-speed applications where both positive and negative edges are used. Thus, a trimming technique is often performed for the clock buffers to compensate for the mismatch, so that the sampling phases can be equally spaced.

A number of techniques have been proposed for the trimming of clock buffers. Existing techniques, however, often use a reference clock to trim the different clock signals. Any duty cycle distortion in the reference clock directly and negatively influences the performance of the clock trim operation. A need therefore exists for improved techniques for the trimming of clock buffers.

SUMMARY OF THE INVENTION

Generally, methods and apparatus are provided for trimming of one or more CDR clock buffers using a histogram of clock-like data patterns. According to one aspect of the invention, one or more clock buffers in a clock and data recovery system are trimmed by receiving a first transmitted clock-like data pattern in a reduced rate mode, wherein the first transmitted clock-like data pattern is transmitted using a first rate mode and wherein the reduced rate mode divides the first rate mode by an integer value that is greater than one; locking the clock and data recovery system using the received version of the first transmitted clock-like data pattern in the reduced rate mode; receiving a second transmitted clock-like data pattern, wherein the second transmitted clock-like data pattern has a run-length that is an integer division of a run-length of the first transmitted clock-like data pattern, wherein the integer division is greater than one; and adjusting a phase of the one or more clock buffers using the second transmitted clock-like data pattern. The first and second transmitted clock-like data patterns can be transmitted by a local transmitter in a loop-back mode.

According to one aspect of the invention, one or more clock buffers in a clock and data recovery system are trimmed by receiving a first transmitted clock-like data pattern in a reduced rate mode, wherein the first transmitted clock-like data pattern is transmitted using a first rate mode and wherein the reduced rate mode divides the first rate mode by an integer value that is greater than one, such that the received version of the first transmitted clock-like data pattern has edges that correspond to only positive or negative edges of the first transmitted clock-like data pattern; locking the clock and data recovery system using the received version of the first transmitted clock-like data pattern in the reduced rate mode; receiving a second transmitted clock-like data pattern; and adjusting a phase of the one or more clock buffers using the second transmitted clock-like data pattern.

A more complete understanding of the present invention, as well as further features and advantages of the present invention, will be obtained by reference to the following detailed description and drawings.

DETAILED DESCRIPTION

The present invention provides methods and apparatus for trimming CDR clock buffers to properly position the CDR data sampling point and CDR timing (transition) sampling point. According to one aspect of the invention, a clock-like data pattern is transmitted from the local transmitter to the local receiver, in a loopback mode, such that the received clock-like data pattern that is used for trimming is insensitive to duty cycle distortion in the transmitter clock. The duty cycle distortion insensitivity is achieved, for example, by utilizing only one edge of a clock period to generate the alignment information for the trimming of the clock buffers. According to a further aspect of the invention, the receiver sampling clock phases are aligned to the approximate center of the receiver data transition using a histogram count optimization technique.

Figure 1:
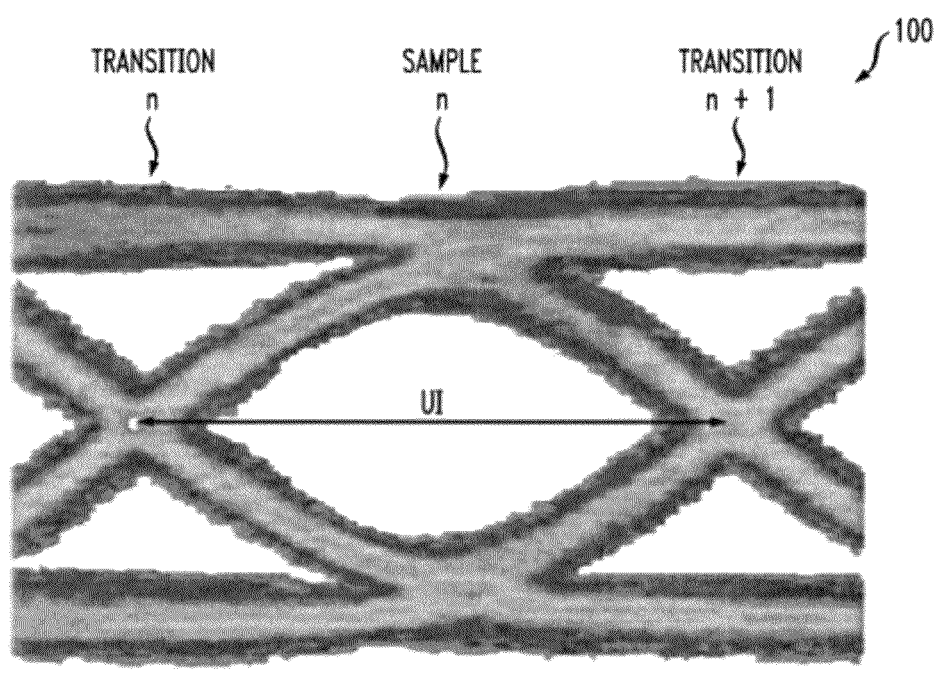
FIG. 1 illustrates transitions within a data stream histogram.
Figure 2:
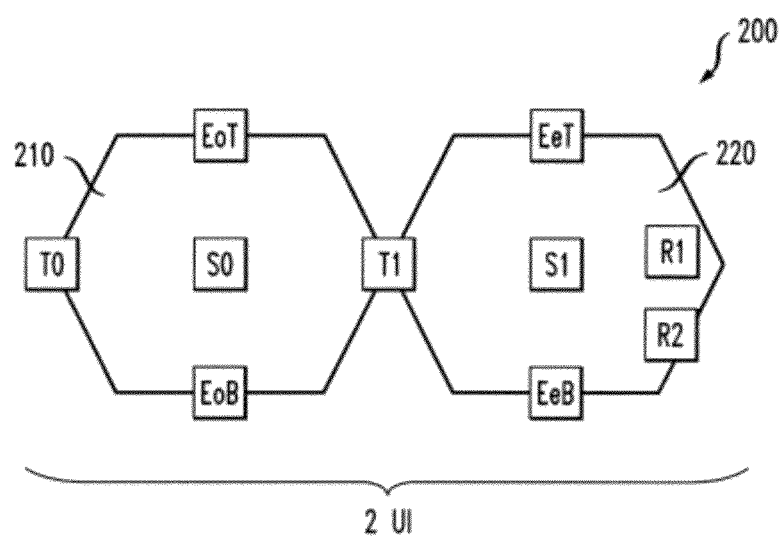
FIG. 2 illustrates an exemplary set of data latches, $S_i$, and transition latches, $T_i$, for sampling a received signal over two unit intervals using corresponding sampling and transition clocks, $S_i$ and $T_i$.

While the present invention is illustrated in the context of an exemplary two unit interval (UI) architecture, the present invention can be applied to an architecture employing any number of UIs, as would be apparent to a person of ordinary skill in the art. FIG. 2 illustrates an exemplary set 200 of data latches, $S_i$, and transition latches, $T_i$, for sampling a received signal over two unit intervals using corresponding sampling and transition clocks, $S_i$ and $T_i$. The first data eye 210 in a two UI window is often referred to as the "odd eye," while the second data eye 220 is often referred to as the "even eye." The exemplary data latches 200 in FIG. 2 comprise a transition latch, T0, a data latch, S0, a top error latch, EoT, and a bottom error latch, EoB, in the odd eye 210. In addition, the exemplary data latches 200 comprise a transition latch, T1, a data latch, S1, a top error latch, EeT, and a bottom error latch, EeB, in the even eye 220. Finally, the exemplary data latches 200 comprise a top roaming latch, R1, and a bottom roaming latch, R2. In an exemplary embodiment, the data and timing sampling are performed alternately between the odd eye 210 and the even eye 220, in a known manner.

Figure 3:
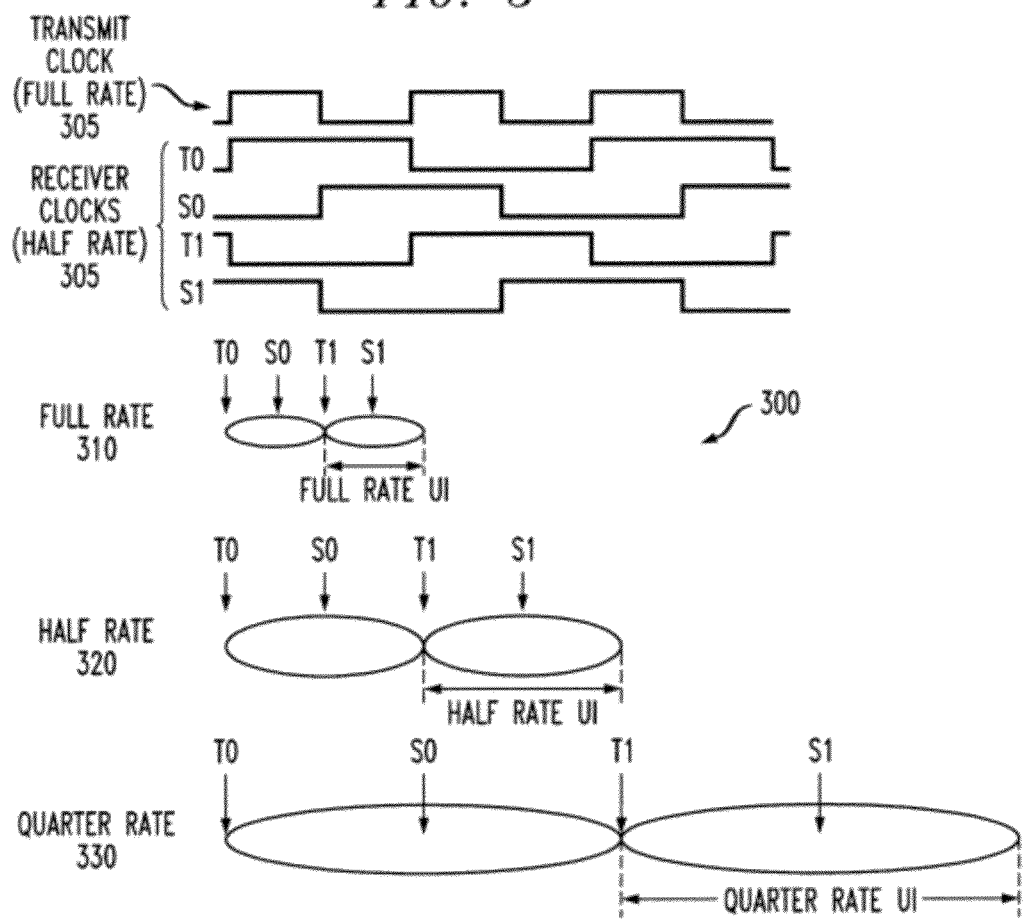
FIG. 3 is a timing diagram illustrating the UI relationship and the clock timing separation among an exemplary transmitter and receiver operating with a full rate clock, a half rate clock and a quarter rate clock.

FIG. 3 is a timing diagram 300 illustrating the UI relationship and the clock timing separation among an exemplary transmitter operating with a full rate transmit clock 305 and an exemplary receiver operating with a full rate clock 310, a half rate clock 320 and a quarter rate clock 330. As shown in FIG. 3, an exemplary receiver operating in a half rate mode can generate transition and data clocks, T0, S0, T1, and S1 at half the rate of the full rate transmit clock 305. The manner in which the full rate transmit clock 305 can be divided to generate full rate, half rate and quarter rate clocks is discussed further below in conjunction with FIG. 5. It is noted, however, that in many implementations, a transmitter transmitting 6G of data may employ a 3G clock and send a bit on each rising and falling edge. The receiver would then sample the received data using a 3G clock.

FIG. 3 also illustrates the sampling points for the transition and data clocks, $T_i$ and $S_i$, respectively, for the odd and even eyes in each two UI window, for each of the full rate clock 310, half rate clock 320 and quarter rate clock 330, relative to the full rate transmit clock 305. For example, the exemplary full rate transmit clock may be a rate of 6 Gbps, the exemplary half rate clock may be a rate of 3 Gbps, and the exemplary quarter rate clock may be a rate of 1.5 Gbps.

Generally, the two transition clocks, T0 and T1, are inverted versions of one another. In addition, the first sampling clock, S0, is phase shifted from the first transition clock T0, by an amount approximately equal to one half (½) of a UI. In addition, the second sampling clock, S1, is an inverted version of the first sampling clock, S0. As shown in FIG. 3, for the full rate transmit clock 305, the sampling points of the two transition clocks, T0 and T1, are aligned with the first and second rising edges, respectively, of the transmit clock 305.

Figure 4:
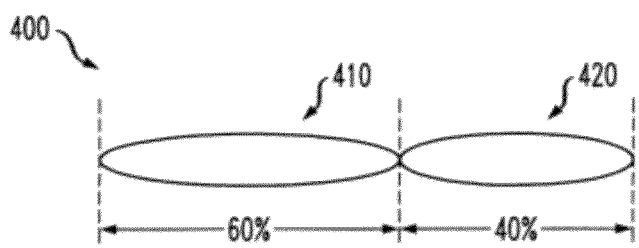
FIG. 4 illustrates the data eyes associated with a received data stream in the presence of duty cycle distortion where the odd data eye is larger than the even data eye within a two UI window.

The present invention recognizes that in the presence of duty cycle distortion, when a transmitter sends a clock-like data pattern, such as a pattern of 10101010, on both the positive and negative edges of the transmit clock, the data stream will exhibit an odd data eye and an even data eye that are unequal. FIG. 4 illustrates the data eyes associated with a received data stream 400 in the presence of duty cycle distortion where the odd data eye 410 is larger than the even data eye 420 within a two UI window. In the presence of duty cycle distortion, a clock-like data pattern is not suitable for use by a clock buffer trim process. As discussed hereinafter, an aspect of the present invention transmits a clock-like data pattern that is immune to duty cycle distortion of the transmit clock.

As indicated above, the present invention transmits a clock-like data pattern from the local transmitter to the local receiver in such a way that the received clock-like data pattern is insensitive to the duty cycle distortion in the transmitter clock. Generally, the present invention achieves insensitivity to the duty cycle distortion by dividing the clock down to a lower rate (for example, from a full rate clock 310 to a half rate clock 320). For example, if transitions in the clock-like data pattern that is used for trimming occur on only the positive edges or the negative edges of the transmit clock, duty cycle distortion will be avoided.

The present invention recognizes that when the local transmitter transmits a clock-like data pattern having transitions on only the positive edges or negative edges of the transmit clock, such as for a clock-like data pattern of 11001100 or a clock-like data pattern of 1111000011110000, the transmitter will effectively transmit data without duty cycle distortion. For the exemplary clock-like data pattern of 11001100 transmitted at full rate, the transmitter will transmit the first "1" of the clock-like data pattern on a first edge, such as a rising edge, and then the second "1" of the pattern will be transmitted on a second edge, such as a falling edge. It is noted that the first edge could also be a falling edge and the second edge could be a rising edge. The receiver will receive a "11" and thus the receiver will not see a transition on the second edge of the transmit clock (since a value of "1" is maintained for two edges). Thus, the duty cycle distortion of the transmitter will not have an effect (since the duty cycle distortion is the result of an imbalance between rising and falling edges). Generally, if the clock-like data pattern has a run-length of an even number, the received pattern will transition on only the positive edges or negative edges of the transmit clock. As discussed hereinafter, the present invention applies this duty cycle distortion reduction technique to provide improved methods and apparatus for clock buffer trim that remove clock edge variability due to device mismatches.

Figure 5:
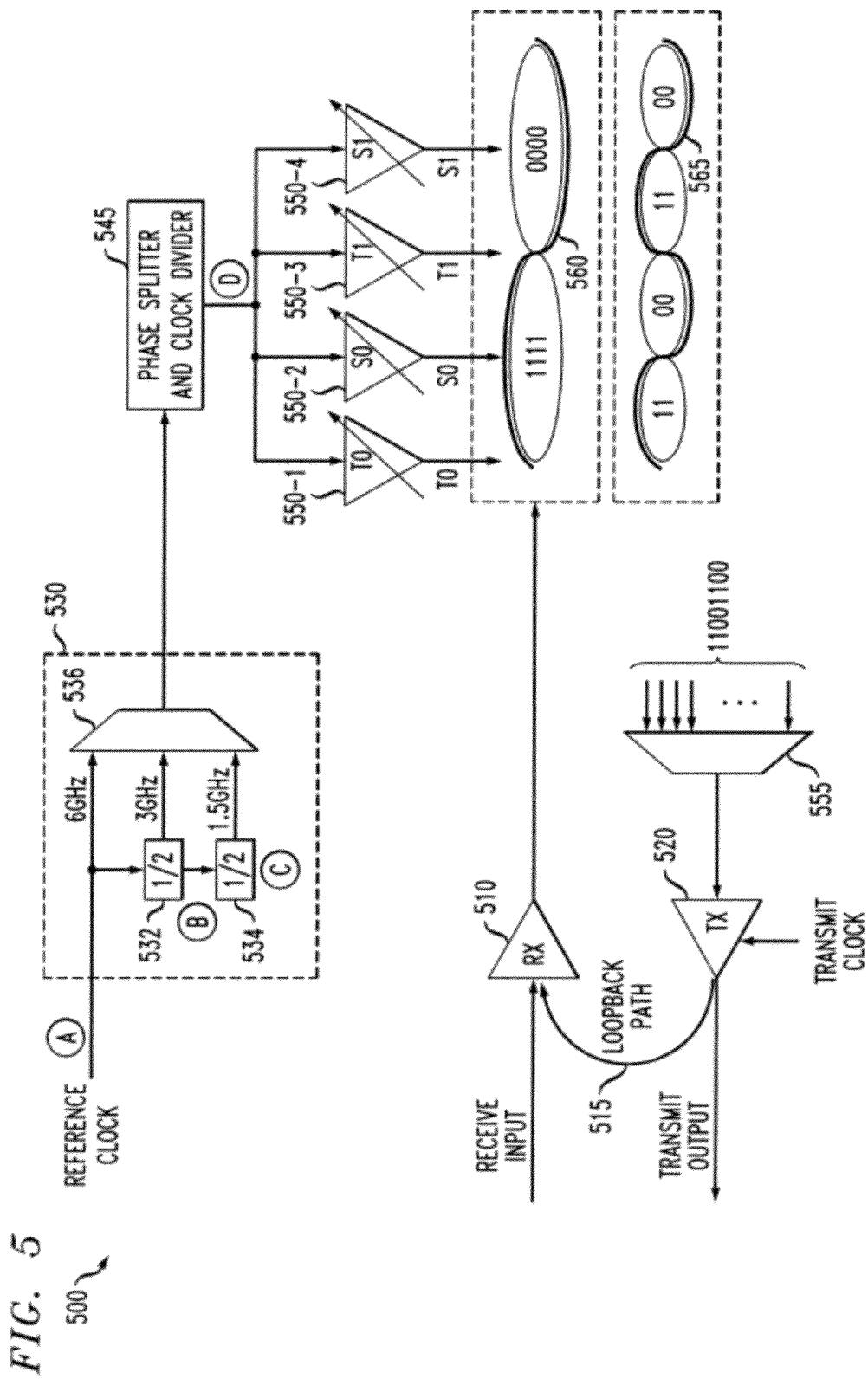
FIG. 5 illustrates an exemplary transceiver in which the present invention can operate.

FIG. 5 illustrates an exemplary transceiver 500 in which the present invention can operate. The exemplary transceiver 500 comprises a receive portion 510 and a transmit portion 520. In addition, a rate selection circuit 530 comprises clock divider elements 532 and 534 and a multiplexer 536. In an exemplary implementation, the multiplexer 536 has three inputs associated with a full rate clock, a half rate clock and a quarter rate clock, respectively. As shown in FIG. 3, the full rate MUX input is coupled to the input full rate reference clock. The half rate MUX input is coupled to the reference clock by means of a single 50% clock divider 532. The quarter rate MUX input is coupled to the reference clock by means of two 50% clock dividers 532 and 534.

In addition, as shown in FIG. 5, the output of MUX 536 is applied to a phase splitter and clock divider 545. Generally, the exemplary phase splitter and clock divider 545 further divides the output of the MUX 536, and generates four phase-offset versions of the selected clock, in a known manner.

The four phase-offset outputs of the exemplary phase splitter and clock divider 545 are each applied to a corresponding clock buffer 550-1 through 550-4 (collectively, referred to herein as clock buffers 550). Generally, the phase-offset versions of the selected clock are phase offset from one another by approximately one-half of a UI. The clock buffers 550 have an adjustable phase. As discussed further below in conjunction with FIG. 7, the present invention trims the phase of the clock buffers 550 in a manner that is insensitive to duty cycle distortion in the transmitter clock.

Figure 7:
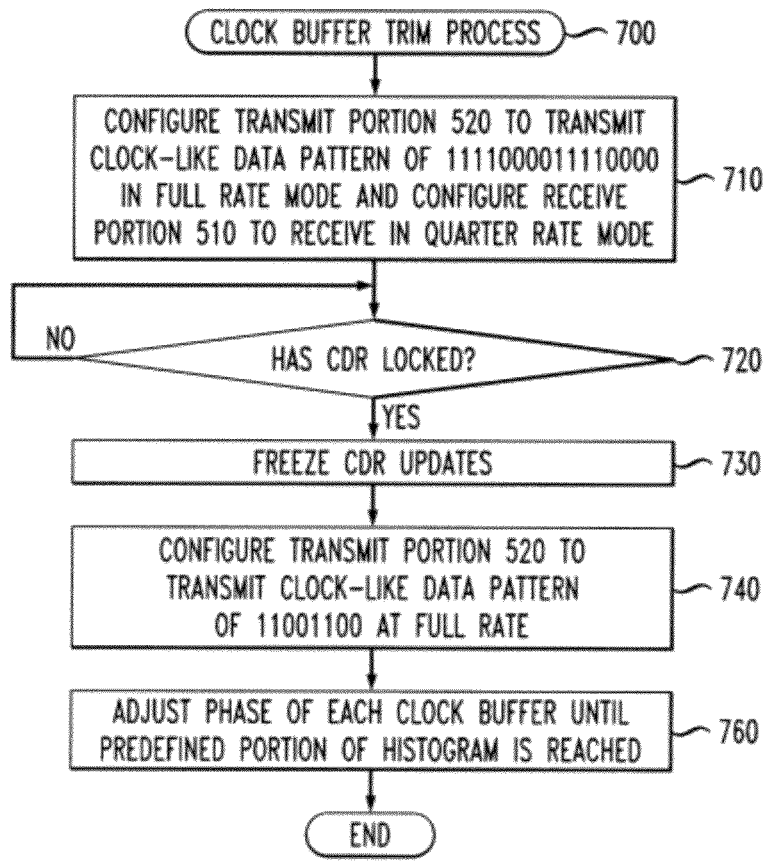
FIG. 7 is a flow chart describing an exemplary implementation of a clock buffer trim process incorporating features of the present invention.

As indicated above, a loopback path 515 is provided so that a clock-like data pattern can be transmitted from the local transmitter 520 to the local receiver 510, in a loopback mode. In this manner, the received clock-like data pattern is insensitive to duty cycle distortion in the transmitter clock when the receiver operates 510 in a lower rate mode than the transmitter 520 (e.g., when the received pattern transitions on only the positive edges or negative edges of the transmit clock). For example, the transmitter 520 can operate in a full rate mode and the receiver 510 can operate in a quarter rate mode. In addition, as discussed further below in conjunction with FIG. 7, the exemplary transceiver 500 also includes a multiplexer 555 for applying the desired clock-like data pattern to the transmit portion 520 for the clock buffer trim process 700 (FIG. 7).

In the loopback mode, the transmitted clock-like data pattern is received by the receiver 510 and the received data stream 560 is sampled using the transition and data sampling clocks, $T_i$ and $S_i$, respectively. As discussed further below in conjunction with FIG. 7, the received data stream 560 corresponds to the CDR locking phase of the clock buffer trim process 700, where the clock-like data pattern is transmitted in a full rate mode, with a run-length of 4.

When the receiver samples the received data stream 560 at quarter rate, it sees the "1111" as a single "1."

Similarly, in a clock buffer trim phase of the clock buffer trim process 700, the transmitted clock-like data pattern is received by the receiver 510 and the received data stream 565 is sampled using the transition and data sampling clocks, $T_1$ and $S_i$, respectively. As discussed further below in conjunction with FIG. 7, the received data stream 565 corresponds to the clock buffer trim phase of the clock buffer trim process 700, where the clock-like data pattern is transmitted in a full rate mode, with a run-length of 2. When the receiver samples the received data stream 565 at quarter rate, it effectively sees the "11" as a half rate signal.

It is noted that the received data stream 565 has transitions that align with the sampling clock buffers 550-2, 550-4 (e.g., the receive portion 510 will see data transitions for both the transition and sampling latches), while the received data stream 560 does not have transitions that align with the sampling clock buffers 550-2, 550-4. Generally, the phases of the adjustable clock buffers 550-1 through 550-4 are adjusted by the disclosed clock buffer trim process 700.

Figure 6:
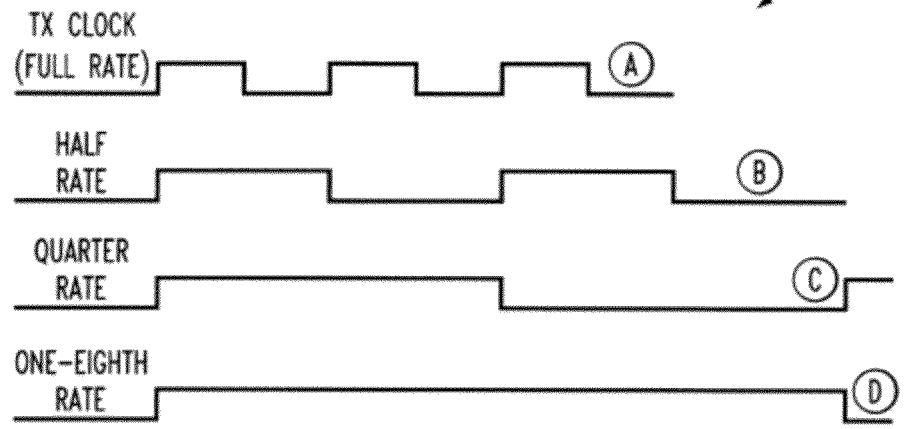
FIG. 6 illustrates a number of clock signals that are present at various identified points in FIG. 5.

FIG. 6 illustrates the various clock signals that are present at various points in FIG. 5. In particular, a full rate clock signal is present at point A in FIG. 5, a half rate clock signal is present at point B in FIG. 5, and a quarter rate clock signal is present at point C in FIG. 5. When the multiplexer 536 selects the quarter rate clock signal, for example, an eighth rate clock signal is present at point D in FIG. 5. It is again noted that there are four phase-offset versions of the selected clock present at point D.

Figure 8:
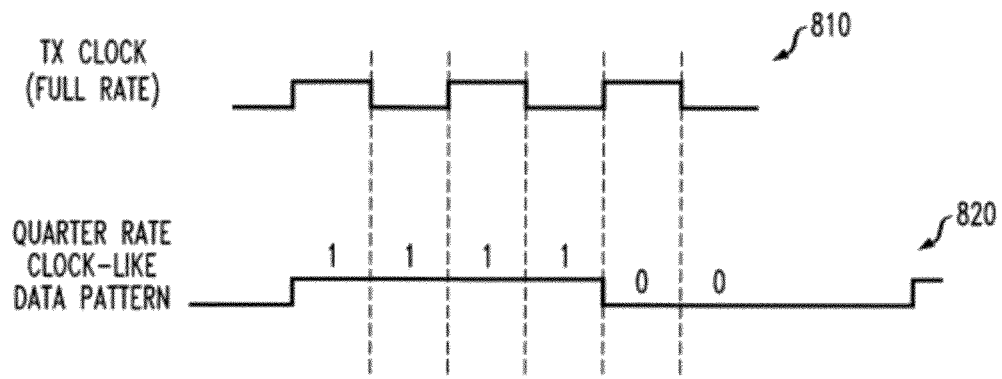
FIG. 8 illustrates a transmitted full rate clock-like data pattern, and the corresponding quarter rate clock-like data pattern that is sampled by the receive portion during the CDR locking phase of the clock buffer trim process of FIG. 7.

FIG. 7 is a flow chart describing an exemplary implementation of a clock buffer trim process 700 incorporating features of the present invention. As shown in FIG. 7, the exemplary clock buffer trim process 700 initially configures the transmit portion 520 to transmit a clock-like data pattern of 1111000011110000 in a full rate mode, and configures the receive portion 510 to receive in a quarter rate mode, during step 710. In the exemplary embodiment of FIG. 5, for quarter rate receiver operation, the clock MUX 536 selects the 1.5 GHz clock as the output. Thus, the receive portion 510 will effectively see a transmitter full rate pattern of 1111000011110000 as a quarter rate clock-like data pattern (e.g., 10101010), since the four consecutive full rate transmitted "1"s will be seen by the receiver 510 as one "1" or "0" in a quarter rate receive signal. FIG. 8 illustrates the full rate transmit clock 810, and the corresponding quarter rate clock-like data pattern 820 (1111000011110000) that is sent by the transmitter 520 and sampled by the receive portion 510 during the CDR locking phase of the clock buffer trim process 700. It is noted that a bit is sent by the transmitter 520 on each rising and falling edge of the full rate transmit clock 810.

Returning to FIG. 7, a test is performed during step 720 to determine if the CDR has locked, while operating the receiver 510 in a quarter-rate mode. If it is determined during step 720 that the CDR has not locked, then program control returns to step 720 until a CDR lock condition is established. Once it is determined during step 720 that the CDR has locked, the CDR updates are frozen during step 730. After the CDR locks on the received quarter rate clock-like data pattern 820, the transition clocks, T0 and T1, are aligned to the transitions (edges) in the clock-like data pattern. It is again noted that the received clock-like data pattern is insensitive to duty cycle distortion in the transmitter clock, because only rising or falling edges of the clock source are used to generate the alignment information.

During step 740, the transmit portion 520 is configured to transmit a half rate clock-like data pattern (e.g., 11001100) at full rate. It is noted that the transmit portion 520 can achieve a half rate clock-like data pattern by maintaining the full rate mode of the transmit portion 520 and changing the transmit pattern to employ a run-length of two.

Figure 9:
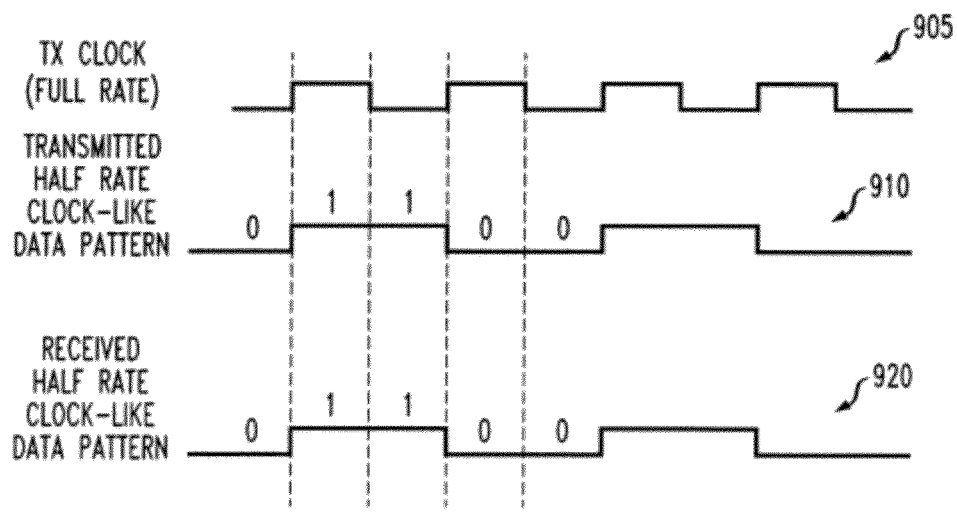
FIG. 9 illustrates a transmitted half rate clock-like data pattern, and the corresponding half rate clock-like data pattern that is sampled by the receive portion during the trim phase of the clock buffer trim process of FIG. 7.

During step 760, the receive portion 510 is configured to receive in a quarter rate mode, while the transmitter 520 is configured to transmit a clock-like data pattern of 110011001100 at full rate. In this manner, the receive portion 510 will see data transitions for both the transition and sampling latches. FIG. 9 illustrates the full rate transmit clock 905, as well as the transmitted half rate clock-like data pattern 910, and the corresponding half rate clock-like data pattern 920 that is sampled by the receive portion 510 during the trim phase of the clock buffer trim process 700. Again, a bit is sent by the transmitter 520 on each rising and falling edge of the full rate transmit clock 905. It is noted that when the transmitter 520 changes the transmit pattern from the quarter rate clock-like data pattern 820 of FIG. 8, to the half rate clock-like data pattern 920 of FIG. 9, the receiver 510 (operating at quarter rate) will see the quarter rate clock-like data pattern 560 and 820 change to a half rate clock-like data pattern 565 and 920. As discussed hereinafter, the data transitions in the half rate clock-like data pattern 920 are employed to trim the sampling point for the corresponding transition and sample latches. In other words, the phase of each clock buffer 550-1 through 550-4 is adjusted to align with the transition (edge) of the respective clock phase.

The phase of each clock buffer is adjusted during step 760 until a predefined portion (such as the middle) of a corresponding histogram is reached. For example, for the clock buffer 550-1 associated with the T0 clock, the phase of the clock buffer 550-1 can be varied over a range of possible values, such as from a minimum delay setting to a maximum delay setting. For each possible delay setting, the sampled data is counted over a predefined time window to create the histogram.

Figure 10:
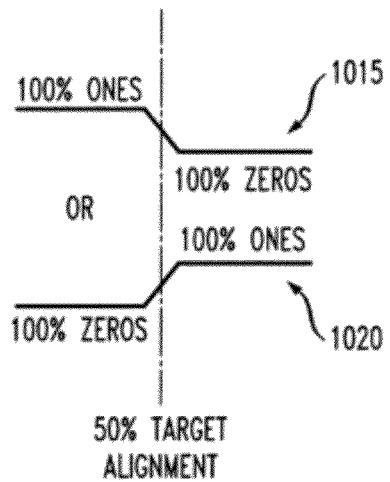
FIG. 10 illustrates a histogram of binary count statistics for a given latch as the phase of a corresponding clock buffer of FIG. 5 is varied over a range of possible values.

FIG. 10 illustrates a histogram of binary count statistics for a given latch, such as latch T0, as the phase of a corresponding clock buffer 550 of FIG. 5 is varied over a range of possible values. For example, when a transition corresponds to a falling edge, the count statistics 1015 will initially be 100% of binary one values sampled at the latch. Likewise, when a transition corresponds to a rising edge, the count statistics 1020 will initially be 100% of binary zero values sampled at the latch. As the phase of the corresponding clock buffer 550 is varied over a range of possible values, at some point, the count statistics 1015, 1020 will demonstrate approximately 50% of binary one values and 50% of binary zero values, substantially at the middle of the clock-like data transition. At this approximate 50% point, the trim setting is determined to be optimized for the given clock buffer. The clock buffer trim step 760 is repeated for each of the S0, T1, and S1 clock buffers.

Figure 11:
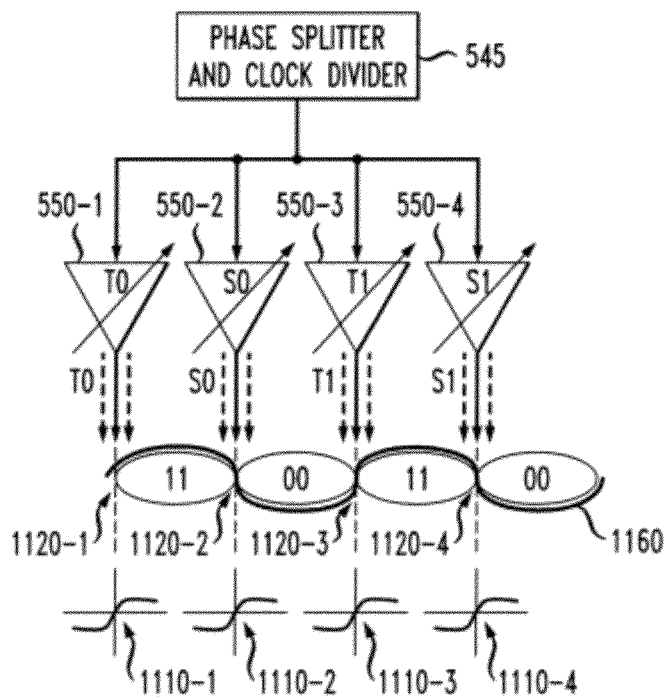
FIG. 11 illustrates the relationship between each histogram of binary count statistics and the corresponding transitions in received data.

FIG. 11 illustrates the relationship between each histogram 1110-1 through 1110-4 of binary count statistics and the corresponding transition 1120-1 through 1120-4 in the received data 1160. As previously indicated, each block buffer 550-1 through 550-4 generates a corresponding clock T0, S0, T1, S1. As shown in FIG. 11, the phase of each clock buffer 550 is adjusted (during step 760 of the clock buffer trim process 700) so that the sampling phase of the corresponding clock T0, S0, T1, S1 is substantially aligned in accordance with the present invention with the approximate center of the corresponding histogram 1110-1 through 1110-4.

While the present invention is illustrated in the context of a transceiver environment, the disclosed CDR clock buffer trimming techniques can be applied in any CDR environment, as would be apparent to a person of ordinary skill in the art.

A plurality of identical die are typically formed in a repeated pattern on a surface of the wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

While exemplary embodiments of the present invention have been described with respect to digital logic blocks, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit, micro-controller, or general-purpose computer. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

System and Article of Manufacture Details

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a recordable medium (e.g., floppy disks, hard drives, compact disks, memory cards, semiconductor devices, chips, application specific integrated circuits (ASICs)) or may be a transmission medium (e.g., a network comprising fiber-optics, the worldwide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

The computer systems and servers described herein each contain a memory that will configure associated processors to implement the methods, steps, and functions disclosed herein. The memories could be distributed or local and the processors could be distributed or singular. The memories could be implemented as an electrical, magnetic or optical memory, or any combination of these or other types of storage devices. Moreover, the term "memory" should be construed broadly enough to encompass any information able to be read from or written to an address in the addressable space accessed by an associated processor. With this definition, information on a network is still within a memory because the associated processor can retrieve the information from the network.

It is to be understood that the embodiments and variations shown and described herein are merely illustrative of the principles of this invention and that various modifications may be implemented by those skilled in the art without departing from the scope and spirit of the invention.

I claim:

1. A method for trimming one or more clock buffers in a clock and data recovery system, comprising:

receiving a first transmitted clock-like data pattern in a reduced rate mode, wherein said first transmitted clock-like data pattern is transmitted using a first rate mode and wherein said reduced rate mode divides said first rate mode by a first integer value that is greater than one;

locking said clock and data recovery system using said received version of said first transmitted clock-like data pattern in said reduced rate mode;

receiving a second transmitted clock-like data pattern, wherein said second transmitted clock-like data pattern has a run-length that is a second integer division of a run-length of said first transmitted clock-like data pattern, wherein said second integer division is greater than one; and adjusting a phase of said one or more clock buffers using said second transmitted clock-like data pattern.

2. The method of claim 1, wherein said first and second transmitted clock-like data patterns are transmitted by a local transmitter in a loopback mode.

3. The method of claim 1, wherein said first integer value comprises one or more of 2, 4, 8 and 16.

4. The method of claim 1, wherein said one or more clock buffers drive a plurality of transition clock signals and data sampling clock signals having a substantially uniform phase separation.

5. The method of claim 1, wherein said adjusting step further comprises the step of adjusting said phase until a corresponding histogram exhibits approximately 50% of each binary value.

6. The method of claim 1, wherein said adjusting step further comprises the step of adjusting said phase of said one or more clock buffers over a range of possible values until a predefined portion of a corresponding histogram is reached.

7. The method of claim 6, wherein said range of possible values comprises a first extreme delay setting to a second extreme delay setting.

8. The method of claim 7, further comprising the step of counting sampled binary values for a plurality of possible delay settings over a predefined time window.

9. The method of claim 1, wherein said first transmitted clock-like data pattern has a run-length of 4 and wherein said second transmitted clock-like data pattern has a run-length of 2.

10. The method of claim 1, wherein said received version of said first transmitted clock-like data pattern is resilient to duty cycle distortion in said first transmitted clock-like data pattern.

11. A system for trimming one or more clock buffers in a clock and data recovery system, comprising:
a receive portion for receiving (i) a first transmitted clock-like data pattern in a reduced rate mode, wherein said first transmitted clock-like data pattern is transmitted using a first rate mode and wherein said reduced rate mode divides said first rate mode by a first integer value that is greater than one; and (ii) a second transmitted clock-like data pattern, wherein said second transmitted clock-like data pattern has a run-length that is a second integer division of a run-length of said first transmitted clock-like data pattern, wherein said second integer division is greater than one;
a clock and data recovery system that is locked using said received version of said first transmitted clock-like data pattern in said reduced rate mode; and
one or more clock buffers, wherein a phase of said one or more clock buffers are adjusted using said second transmitted clock-like data pattern.

12. The system of claim 11, wherein said first and second transmitted clock-like data patterns are transmitted by a local transmitter in a loopback mode.

13. The system of claim 11, wherein said first integer value comprises one or more of 2, 4, 8 and 16.

14. The system of claim 11, wherein said one or more clock buffers drive a plurality of transition clock signals and data sampling clock signals having a substantially uniform phase separation.

15. The system of claim 11, wherein said adjusting step further comprises the step of adjusting said phase until said corresponding histogram exhibits approximately 50% of each binary value.

16. The system of claim 11, wherein said first transmitted clock-like data pattern has a run-length of 4 and wherein said second transmitted clock-like data pattern has a run-length of 2.

17. The system of claim 11, wherein said phase of said one or more clock buffers is adjusted over a range of possible values until a predefined portion of a corresponding histogram is reached.

18. The system of claim 17, wherein said range of possible values comprises a first extreme delay setting to a second extreme delay setting.

19. The system of claim 18, further comprising the step of counting sampled binary values for a plurality of possible delay settings over a predefined time window.

20. A method for generating one or more clocks for use in trimming one or more clock buffers in a clock and data recovery system, comprising:
receiving a first transmitted clock-like data pattern in a reduced rate mode, wherein said first transmitted clock-like data pattern is transmitted using a first rate mode and wherein said reduced rate mode divides said first rate mode by a first integer value that is greater than one, such that said received version of said first transmitted clock-like data pattern has edges that correspond to only positive or negative edges of said first transmitted clock-like data pattern;
locking said clock and data recovery system using said received version of said first transmitted clock-like data pattern in said reduced rate mode;
receiving a second transmitted clock-like data pattern, wherein said second transmitted clock-like data pattern has a run-length that is a second integer division of a run-length of said first transmitted clock-like pattern, wherein said second integer division is greater than one; and
adjusting a phase of said one or more clock buffers using said second transmitted clock-like data pattern.

21. The method of claim 20, wherein said first and second transmitted clock-like data patterns are transmitted by a local transmitter in a loopback mode.

* * * * *